United States Patent
Rijken et al.

(10) Patent No.: US 6,856,139 B2
(45) Date of Patent: Feb. 15, 2005

(54) APPARATUS FOR AUTONOMOUS ACTIVATION OF SYSTEM/CHASSIS COOLING FAN

(75) Inventors: Christopher N. Rijken, Houston, TX (US); Mark D. Tupa, Cypress, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 174 days.

(21) Appl. No.: 10/154,682

(22) Filed: May 24, 2002

(65) Prior Publication Data

US 2003/0218465 A1 Nov. 27, 2003

(51) Int. Cl.$^7$ ............................................. H01H 31/02
(52) U.S. Cl. ..................................... 324/537; 165/80.2
(58) Field of Search ........................ 165/80.2; 324/537

(56) References Cited

U.S. PATENT DOCUMENTS

| | | | | |
|---|---|---|---|---|
| 6,270,319 B1 | * | 8/2001 | Lyszkowski et al. | 417/2 |
| 6,276,900 B1 | * | 8/2001 | Lyszkowski et al. | 417/2 |
| 6,295,567 B1 | * | 9/2001 | Bassman et al. | 710/104 |
| 6,340,874 B1 | * | 1/2002 | Vladimir | 318/471 |
| 6,463,891 B2 | * | 10/2002 | Algrain et al. | 123/41.12 |
| 2001/0029907 A1 | * | 10/2001 | Algrain et al. | 123/41.29 |
| 2003/0100959 A1 | * | 5/2003 | Liu | 700/21 |
| 2003/0121642 A1 | * | 7/2003 | Thompson et al. | 165/80.2 |
| 2003/0236594 A1 | * | 12/2003 | Frankel et al. | 700/300 |

FOREIGN PATENT DOCUMENTS

JP 05100063 A * 4/1993 ............ G12B/15/00

* cited by examiner

Primary Examiner—Charles H. Nolan, Jr.

(57) ABSTRACT

An electronic system has at least two fans such as a first fan and a second fan. The first fan is controlled (e.g., on/off, speed) in response a system parameter (e.g., temperature, system operational state). Preferably, the second fan is controlled dependent on the operation of the first fan. The electronic system may be a computer system. In this case, the first fan preferably is a CPU fan and the second fan is a chassis fan.

14 Claims, 2 Drawing Sheets

APPARATUS FOR AUTONOMOUS ACTIVATION OF SYSTEM/CHASSIS COOLING FAN

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

1. Field of the Invention

The present invention generally relates to cooling an electronic system such as a computer system. More particularly, the present invention relates to a technique for cooling a computer while reducing fan noise. Still more particularly, the invention relates to controlling the operation of a chassis fan based on the operation of another fan (e.g., a CPU fan).

2. Background Information

Computer systems include numerous electrical components that draw electrical current to perform their intended functions. A computer's microprocessor or central processing unit ("CPU") requires electrical current to perform many functions such as controlling the overall operations of the computer system and performing various numerical calculations. Any electrical device through which electrical current flows produces heat. The amount of heat any one device generates generally is a function of the amount of current flowing through the device.

Typically, each manufacturer designs its products to operate correctly within a predetermined temperature range. If the temperature exceeds the predetermined range (i.e., the device becomes too hot or too cold), the device may not function correctly thereby potentially degrading the overall performance of the computer system. Thus, it is desirable for a computer system generally, and its components specifically, to operate within a thermally benign environment.

A conventional computer system includes one or more fans to blow air over the electronics to keep the electronics cool. A fan's ability to cool a computer is a function of the volume and speed of the airflow it is able to create. Faster fans generally provide greater cooling ability than slower fans. Fans, however, also make noise and the noise level is a function of the speed of the fan; faster fans are noisier than slower fans.

In some computers having a single fan, the fan is turned on when the computer is turned on and operated at a predetermined speed until the computer is turned off. Although very simple and satisfactory for cooling purposes, this approach results in the fan continuously making a great deal of noise, which is generally annoying to the operator. In other computers, to reduce fan noise, upon boot up, the fan initially is activated at a relatively slow speed and spun faster only if it is determined (using, for example, a thermal sensor) that the computer has become hotter. Once an increase in temperature is detected, the fan speed is increased. This approach recognizes that a computer that has just booted up and does not yet generate much heat does not need its fan to spin at a high speed. Such a computer may include one or more temperature sensors that are monitored to determine the thermal state of the computer. If it is determined that the computer is becoming too hot, the fan's speed can be increased. Although increasing fan speed disadvantageously increases the sound level of the computer, generally it is a necessary act to keep the computer from overheating.

Early microprocessors dissipated a couple of watts of energy. Today's microprocessors dissipate tens of watts (e.g., 60 watts) and thus become considerably hotter than early microprocessors. In fact, today's microprocessors typically require a dedicated fan whose primary purpose is to cool the microprocessor (also called a "CPU"). Such computers typically also have an additional chassis fan whose purpose is to help cool other portions of the computer such as most of the interior volume of the chassis.

Some techniques for fan speed control involve the computer's basic input/output system ("BIOS") code. The BIOS generally is low level code which provides control over various low level functions in the computer. One such function is fan speed. Thus, BIOS code can be executed to change the speed of one or more of the computer's fans. Executing BIOS code in this manner, however, generally requires the operating system to be temporarily interrupted while the BIOS code runs. Interrupting the operating system detrimentally impacts overall system performance and thus is undesirable.

With two fans in a computer system, the noise level from the computer may become annoyingly loud. As a result, there is a need to provide a cooling system for a computer that minimizes the sound level of the fans as much as possible. These two design goals are generally at odds with each other—a fan capable of keeping a computer sufficiently cool generates a great deal of noise and a quiet fan may be unable to sufficiently cool the computer, all else being equal. Accordingly, there is a need to provide a cooling system for a computer that effectively trades off system cooling and fan noise. At the same time, it is desirable to reduce the cost and complexity of a computer system. Thus, the provision of additional benefits and features preferably should not require additional circuitry. Moreover, it is desirable to provide adequate cooling, while minimizing sound level and system complexity and also maintaining the computer at as high a performance level as possible.

BRIEF SUMMARY OF THE PREFERRED EMBODIMENTS OF THE INVENTION

The problems noted above are solved in large part by an electronic system having at least two fans such as a first fan and a second fan. The first fan is controlled (e.g., on/off, speed) in response a system parameter (e.g., temperature, system operational state). Preferably, the second fan is controlled dependent on the operation of the first fan.

The invention may be embodied as an electronic system comprising a first fan, a second fan, a drive circuit coupled to the first and second fans, monitor logic which monitors a system parameter, and a fan dependent control unit coupled to the drive circuit, the second fan and a voltage source. The drive circuit produces a fan speed voltage which controls the speed of the first and second fans. Further, the monitor logic causes the drive circuit to produce a fan speed voltage at a level to operate the first fan at a desired speed based on the system parameter. The fan dependent control unit controls the second fan based on the operation of the first fan. The fan dependent control unit preferably compares the fan speed voltage signal, which is indicative of the speed of the first fan, to a threshold. When the fan speed voltage signal exceeds the threshold, the comparator asserts a switch control signal to a normally open electronic switch which also is included as part of the fan dependent control unit. The switch control signal causes the switch to close thereby providing the voltage source to the second fan and causing the second fan to operate.

The electronic system may be a computer system. In this case, the first fan may be a CPU fan configured to help cool the computer's CPU and the second fan may be a chassis fan configured to help generally cool the interior volume of the computer's chassis.

The embodiments of the invention provide a mechanism whereby two fans are controlled with only a single drive circuit. Further, the fan control methodology described herein is based only on hardware and does not require any involvement by software (e.g., BIOS). However, if desired, a software override mechanism can be included to override the hardware-based fan control mechanism. This may be particularly useful for testing one or all of the fans during system initialization. These and other advantages will become apparent upon reviewing the following disclosure.

BRIEF DESCRIPTION OF THE DRAWINGS

For a detailed description of the preferred embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component and sub-components by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either a direct or indirect electrical connection. Thus, if a first device couples to a second device, that connection may be through a direct electrical connection, or through an indirect electrical connection via other devices and connections. The term central processing unit (or "CPU") refers to a processor chip, also called a "microprocessor." To the extent that any term is not specially defined in this specification, the intent is that the term is to be given its plain and ordinary meaning.

DETAILED DESCRIPTION OF THE PREFERRED EMBODIMENTS

In accordance with a preferred embodiment of the invention, an electronic system (e.g., a computer system) includes at least two fans—a first fan and a second fan. Preferably, the first fan is controlled as a result of monitoring a system parameter such as temperature, operational state, etc. The second fan preferably is controlled based on the operation of a first fan. More specifically, the speed of the second fan is controlled as a function of the speed of the first fan. Thus, the second fan is directly operated based on the first fan and indirectly controlled as a result a system parameter. Further, a single fan drive circuit is used to control the operation of both fans, rather than providing a separate drive circuit for each fan. Further still, the operation of both fans preferably is controlled without software intervention such as by the computer's BIOS. However, if desired software control of the speed of the second fan can be included in addition to the aforementioned hardware-based control technique. Software control of the speed of the second fan can be added to provide a software override mechanism of the hardware-based fan speed control mechanism for a variety of reasons such as fan testing.

The preferred embodiment of fan speed control can be adapted to any type of electronics equipment in which two or more fans is desired or needed. The following describes an embodiment of the invention in the context of a computer system, but this disclosure should not be limited to that context unless otherwise stated or claimed.

Figure 1:
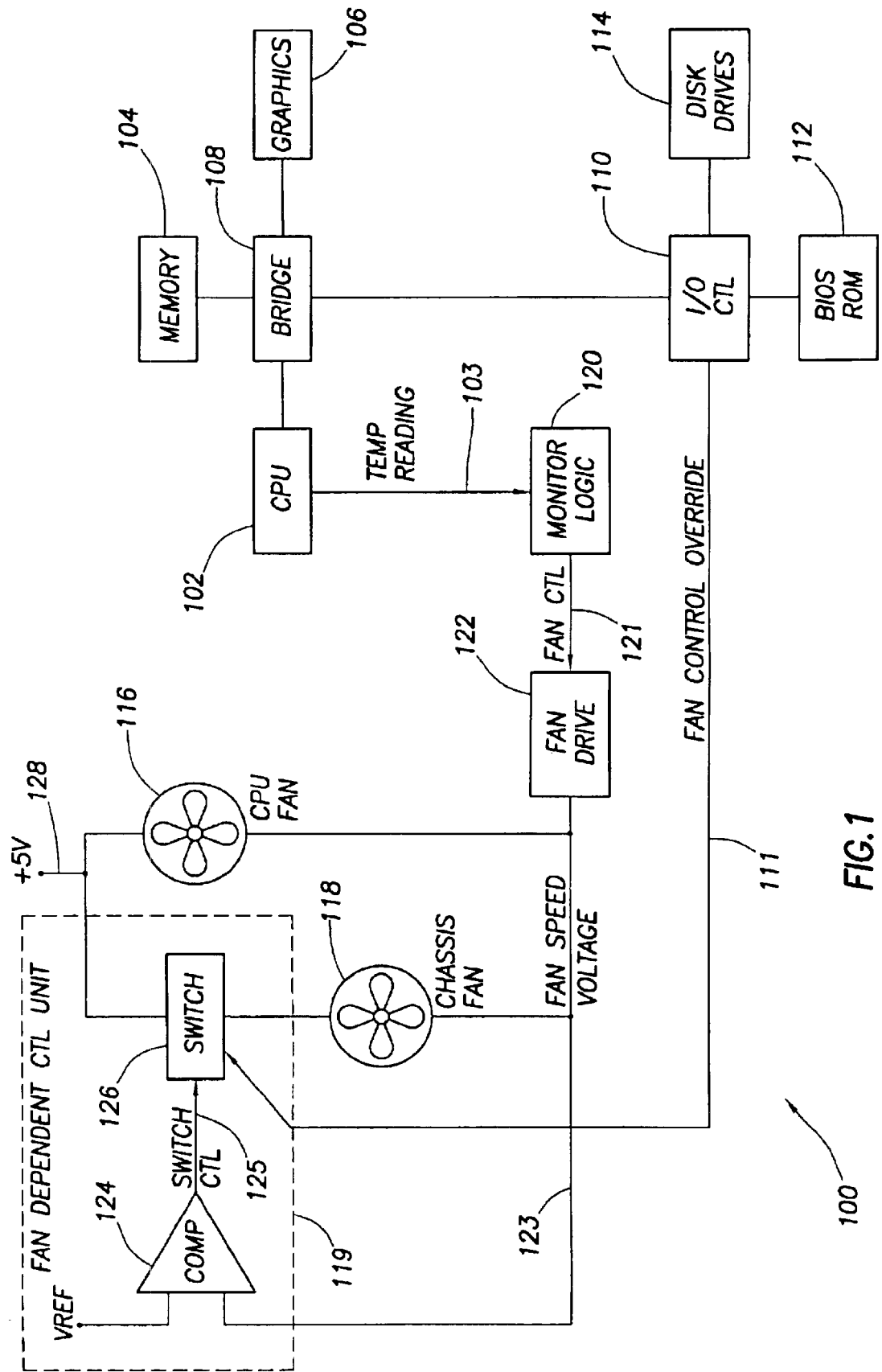
FIG. 1 shows a preferred embodiment of a computer system having two fans in which the speed of a first fan is used to control the operation of a second fan.

FIG. 1 shows a computer system 100 configured in accordance with a preferred embodiment of the invention. Computer system 100 preferably includes at least one central processing unit ("CPU") 102, main system memory 104 and a graphics subsystem 106 coupled to a bridge device 108. The CPU 102 may be any suitable type of processor such as a Pentium 4 processor provided by Intel. The graphics subsystem 106 preferably includes a graphics controller and a display. The bridge 108, which may be a memory controller hub device (e.g., 82850) selected from a family of such devices also provided by Intel, coordinates data transfers between the CPU 102, main system 104, and graphics subsystem 106.

An input/output ("I/O") controller 110 also couples to the bridge 108. The I/O controller 110 can be any suitable controller such as the 82801 I/O controller hub provided by Intel. The I/O controller 110 provides a focal point for the interconnection of a plurality of various devices such as disk drive(s) 114, a BIOS read only memory ("ROM") 112, and other devices (not shown). BIOS ROM 112 preferably contains BIOS code which is executed by CPU 102. The BIOS code may initially be executed directly from the BIOS ROM 112 and subsequently be copied to main system memory 104 for execution therefrom.

The system 100 shown in FIG. 1 includes two fans 116 and 118, although additional fans can be included if desired. Preferably, fan 116 functions to help cool the CPU 102 and is the "first" fan described above. Fan 118 functions to help cool other portions of the computer system and is the "second" fan described above. Fan 118 is frequently referred to as the chassis fan in that it typically is mounted on a sidewall of the computer's chassis (not specifically shown) and functions to move area across the system board on which the electronics shown in FIG. 1 are mounted.

Referring still to FIG. 1, CPU 102 preferably includes a temperature sensor on or in the CPU device. For example, the CPU may include one or more thermal diodes embedded on or near the silicon die itself contained within the chip. The CPU 102 further provides an output signal 103 labeled as "temperature reading" in FIG. 1. This output signal preferably is an analog voltage whose amplitude is representative of the temperature of the CPU. For example, the temperature reading signal 103 may be directly proportional to the internal temperature of the CPU.

Referring still to FIG. 1, the CPU's temperature reading signal 103 is provided to monitor logic 120 which preferably is an off-the-shelf semiconductor device such as the ADM1027 provided by Analog Devices or the EMC6D101 provided by SMSC. The monitor logic 120 performs the function of converting the analog temperature reading signal 103 to a signal suitable for operating the fans 116 and 118. In accordance with a preferred embodiment of the invention, the monitor logic 120 converts the analog temperature reading signal 103 to a pulse width modulated ("PWM") signal in which the amplitude of the temperature reading signal voltage is encoded by varying the width of a pulse train in accordance with known techniques. The resulting PWM signal is shown as fan control signal 121 provided as an output signal from the monitor logic 121. Thus, the monitor logic 120 generally comprises an analog-to-pulse width modulation converter.

The PWM-based fan control signal 121 is provided by the monitor logic 120 to a fan drive 122. The fan drive 122 includes circuitry which produces an appropriate DC-based fan speed voltage 123 based on the fan control signal 121. The fan speed voltage 123 preferably is a function of the fan control signal 121. As shown, both the CPU fan 116 and the chassis fan 118 are coupled to a positive DC voltage 128 (e.g., +5V), although the positive DC voltage 128 is provided to the chassis fan 118 via a fan dependent control unit 119. The speed of each fan is controlled by the magnitude of the voltage across the fan. Because the positive voltage supply to each fan is fixed, the speed of each fan, and whether the fan is on or off, is controlled by the negative voltage supply to the fan via the fan speed voltage signal 123.

The fan dependent control unit 119 preferably activates the chassis fan 118 dependent upon the operation of the CPU fan 116. The fan dependent control unit preferably comprises a comparator 124 coupled to a switch 126, although other embodiments and configurations are possible also and should be considered as within the scope of this disclosure and accompanying claims. The switch 126, which in the preferred embodiment comprises a p-channel field effect transistor ("FET"), is controlled by a switch control signal 125 provided by a comparator 124. The comparator 124 compares the magnitude of the fan speed voltage 123 to a reference voltage (Vref) and asserts the switch control signal 125 to an active state when the fan speed voltage exceeds the reference voltage in a negative sense.

During system initialization, the power-on self-test ("POST") process loads a temperature table into the monitor logic 120. The table specifies appropriate CPU fan speeds for various CPU temperatures. The monitor logic 120 uses the temperature reading from the CPU and the table to generate a fan control signal 121 so as to cause the CPU fan 116 to spin at a desired speed. In some systems 100, any one of a plurality of CPUs can be included as the CPU 102. In such cases, during system initialization, the system determines the particular CPU included and sets the temperature table in the monitor logic 120 accordingly. That is, different CPUs may require different temperature tables and the correct table is automatically loaded during system initialization.

As explained above, the fan drive 122 receives the fan control signal 121 which is encoded in such a way so as to dictate the desired speed of CPU fan 116. The fan drive 122 generates a corresponding fan speed voltage 123 so as to cause CPU fan 116 to spin at the speed dictated by the temperature table set up in monitor logic 120.

In accordance with the preferred embodiment of the invention, the comparator 124 and switch 126 control the operation of the chassis fan as a function of the operation of the CPU fan 116. It has been determined that usually the CPU 102 is the hottest component in the system 100 and that often only the CPU fan 116 is needed to operate—the rest of the system 100 may be cool enough so that chassis fan 118 is not required. Further, it can be shown that the chassis fan 118 may not be needed to spin at all until the CPU temperature exceeds a certain threshold. Accordingly, rather than directly monitoring a system parameter (e.g., temperature) to control the chassis fan, the system 100 sets the speed of the chassis fan in relation to the speed of the CPU fan 116.

More specifically, the comparator 124 compares the level of the fan speed voltage 123, which is proportional to the speed of the CPU fan 116, to a reference voltage. The comparator 124 prevents the chassis fan 118 from spinning until the fan speed voltage, and thus the speed of the CPU fan, exceeds a predetermined level. Once the fan speed voltage exceeds the reference voltage, the comparator asserts the switch control signal 125 which, in turn, causes the switch 126 to close thereby providing the positive voltage supply (+5V) to the chassis fan 118. This methodology is based on the assumption that CPU fan speed is an indicator of how hot the CPU 102 is becoming—faster fan speed means hotter CPU, and vice versa. This methodology is also based on the assumption that an increase in CPU temperature will generally be associated with an increase in temperature in other portions of the computer systems for which the chassis fan 118 would be beneficial. Thus, in accordance with the preferred embodiment of the invention, the coordinated action of the comparator 124 and switch 126 cause the chassis fan 118 to turn on and begin assisting in cooling the computer once the CPU fan speed has reached a predetermined level generally indicative of, or at least correlated to, general chassis temperature.

Of course the reference voltage, Vref, can be set to any level. Different levels of the reference voltage will cause the chassis fan to turn on at different CPU fan speeds. In general, a higher magnitude reference voltage will result in the CPU fan spinning faster before the chassis fan will turn on.

Figure 2:
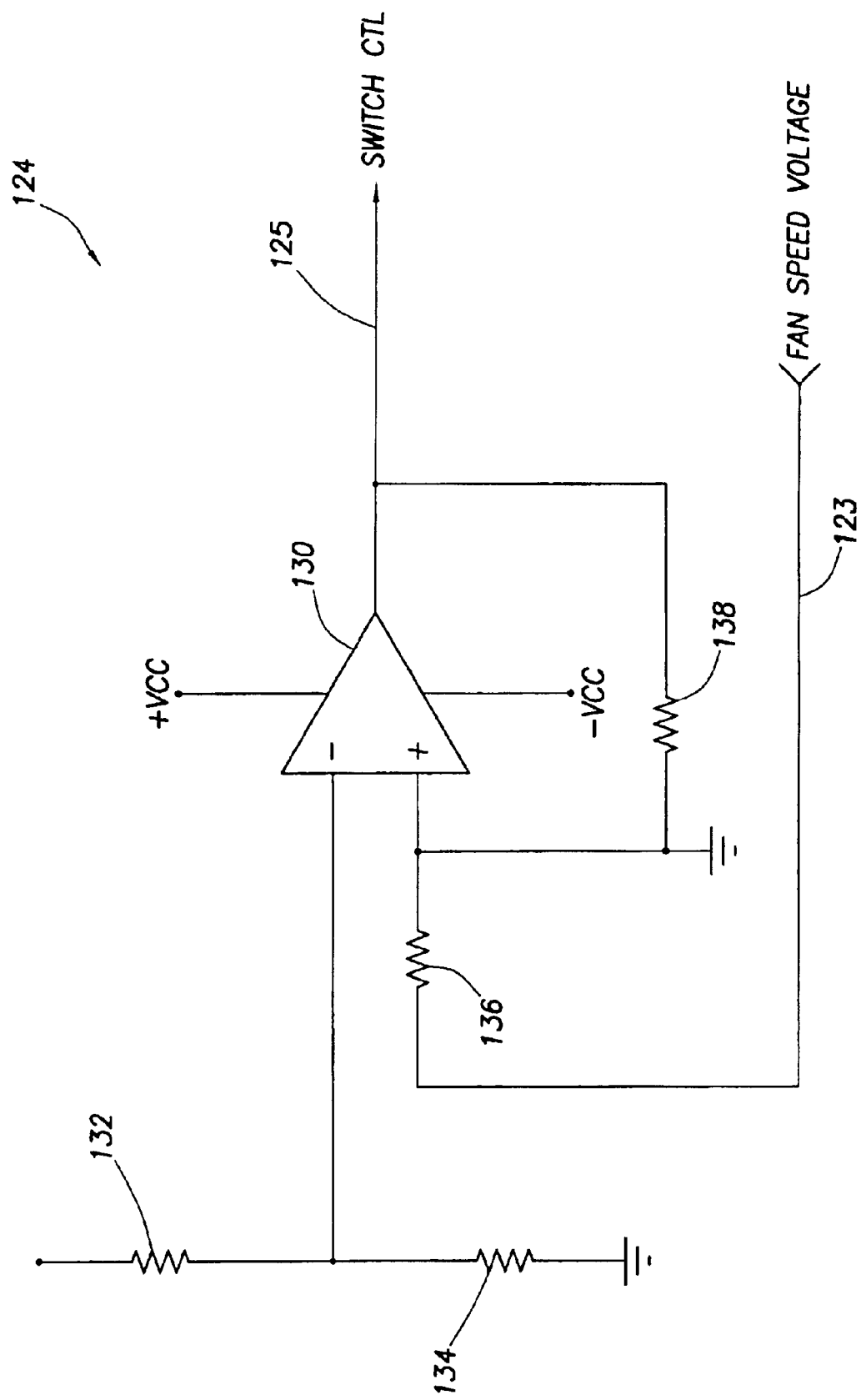
FIG. 2 shows a preferred embodiment of a comparator used in the system of FIG. 1 to compare the speed of the first fan to a predetermined threshold.

Referring now to FIG. 2, a preferred embodiment of the comparator 124 is shown as comprising an operational amplifier ("op amp")-based comparator circuit. The reference voltage, Vref, preferably is formed using a voltage divider comprising resistors 132 and 134. In the embodiment of FIGS. 1 and 2, the reference voltage is a negative voltage provided to the inverting input of the op amp 130. The fan speed voltage 123 is provided via a resistor 136 to the non-inverting input of op amp 130. A feedback resistor 138 connects between the op amp's non-inverting input and output and also connects to ground as shown. The comparator circuit 124 shown in FIG. 2 includes hysteresis provided by the combination of resistors 136 and 138. As is well known, hysteresis prevents the comparator's output signal from oscillating between two states as the fan speed voltage input "hovers" around the reference voltage. Varying the values of resistors 136, 138 can provide different levels of hysteresis.

The embodiment shown in FIG. 1 advantageously permits the chassis fan 118 to be controlled without involvement from software, such as BIOS. However, if desired, the system 100 can be programmed to permit software control of chassis fan 118 in addition to, or instead of, the hardware control described above. An example of when it might be desired to provide fan control via software is during POST when it is desired to test the chassis fan. A fan test may include simply turning on the fan and verifying that the fan is actually rotating by monitoring a voltage produced by the fan as a result of its blade rotation. Accordingly, BIOS ROM 112 includes code that is executed by CPU 102 to turn on the chassis fan. In response, the CPU 102 causes the I/O controller 110 to assert a fan control override signal 111 to the switch 126 which controls the chassis fan 118. The fan control override signal 111 causes the switch 126 to close regardless of the state of the switch control signal 125 from the comparator 124. Thus, in the embodiment shown in FIG. 1, the chassis fan is normally activated only by hardware (i.e., no software involvement) in relation to the CPU fan operation, but such hardware control can be overridden by software such as the computer's BIOS.

As shown in the preferred embodiment of FIG. 1, computer system 100 includes only one fan drive circuit 122 to drive at least two fans 116 and 118. This system is thus simpler, has fewer parts, requires less space on a system board, and costs less to manufacture and test than a computer system having two fan drive circuits.

The above discussion is meant to be illustrative of the principles and various embodiments of the present invention. Numerous variations and modifications will become apparent to those skilled in the art once the above disclosure is fully appreciated. For example, the above protocols involve changes in the speed of a fan, but can be implemented with other techniques and device for cooling an electronics system (e.g., refrigeration). Further, the particular circuit implementations shown in the figures may be modified in a number of different ways without departing from the principles and scope of this disclosure. Components can be added or removed from the circuits and different circuits altogether that provide the same benefits and functionality can be used. It is intended that the following claims be interpreted to embrace all such variations and modifications.

What is claimed is:

1. An electronic system, comprising:
   a first fan;
   a second fan;
   a drive circuit coupled to said first and second fans, said drive circuit producing a fan speed voltage which controls the speed of said first and second fans;
   monitor logic which monitors a system parameter and causes said drive circuit to produce a fan speed voltage at a level to operate the first fan at a desired speed based on said system parameter;
   a fan dependent control unit coupled to said drive circuit and said second fan and which controls said second fan based on the operation of the first fan; and
   a CPU coupled to said monitor logic and said first fan functions to help cool said CPU;
   wherein said CPU includes a temperature sensor and provides a temperature reading to said monitor logic, wherein said system parameter includes said temperature reading of said CPU.

2. An electronic system, comprising:
   a first fan;
   a second fan;
   a drive circuit coupled to said first and second fans, said drive circuit producing a fan speed voltage which controls the speed of said first and second fans;
   monitor logic which monitors a system parameter and causes said drive circuit to produce a fan speed voltage at a level to operate the first fan at a desired speed based on said system parameter;
   a fan dependent control unit coupled to said drive circuit and said second fan and which controls said second fan based on the operation of the first fan; and
   a CPU coupled to said monitor logic and said first fan functions to help cool said CPU;
   wherein said second fan is a chassis fan mounted on a chassis in which said first fan, drive circuit, monitor logic and fan dependent control unit reside.

3. The system of claim 2 wherein said fan dependent control unit includes a comparator which compares the fan speed voltage to a threshold and causes said second fan to spin when said fan speed voltage exceeds said threshold.

4. An electronic system, comprising:
   a first fan;
   a second fan;
   a drive circuit coupled to said first and second fans, said drive circuit producing a fan speed voltage which controls the speed of said first and second fans;
   monitor logic which monitors a system parameter and causes said drive circuit to produce a fan speed voltage at a level to operate the first fan at a desired speed based on said system parameter;
   a fan dependent control unit coupled to said drive circuit and said second fan and which controls said second fan based on the operation of the first fan;
   wherein said fan dependent control unit includes a comparator which compares the fan speed voltage to a threshold and causes said second fan to spin when said fan speed voltage exceeds said threshold and said fan dependent control unit further includes a normally open electronic switch coupled to said comparator, a voltage source and said second fan, wherein said comparator asserts a switch control signal when said fan speed voltage exceeds said threshold which causes said switch to close to permit said voltage source to be provided to said second fan thereby causing said second fan to spin.

5. The system of claim 1 wherein said CPU executes software, said software causing an override signal to be asserted to said fan dependent control unit to cause said second fan to operate as dictated by said software.

6. The computer system of claim 4 wherein said system parameter is temperature.

7. A computer system housed in a chassis, comprising:
   a CPU;
   a CPU fan configured to help cool the CPU;
   a chassis fan configured to help cool an interior volume of the chassis;
   a fan drive coupled to said CPU and chassis fans, said fan drive produces a fan speed voltage which controls the speed of said CPU and chassis fans;
   monitor logic coupled to said fan drive and which monitors a system parameter and causes said fan drive to produce a fan speed voltage at a level to operate said CPU fan at a desired speed based on said system parameter; and
   a fan dependent control unit coupled to said fan drive and said chassis fan and which controls said chassis fan based on how fast said CPU fan is spinning and said fan dependent control unit turns on said chassis fan when the speed of said CPU fan reaches a threshold.

8. The computer system of claim 7 wherein said CPU includes a temperature sensor and provides a temperature reading to said monitor logic, wherein said system parameter includes said temperature reading of said CPU.

9. A computer system housed in a chassis, comprising:
   a CPU;
   a CPU fan configured to help cool the CPU;

a chassis fan configured to help cool an interior volume of the chassis;

a fan drive coupled to said CPU end chassis fans, said fan drive produces a fan speed voltage which controls the speed of said CPU and chassis fans;

monitor logic coupled to said fan drive and which monitors a system parameter and causes said fan drive to produce a fan speed voltage at a level to operate said CPU fan at a desired speed based on said system parameter; and a fan dependent control unit coupled to said fan drive and said chassis fan and which controls said chassis fan based on how fast said CPU fan is spinning and said fan dependent control unit includes a comparator which compares a signal indicative of the speed of the CPU fan to a threshold and causes said chassis fan to spin when said fan speed voltage exceeds said threshold.

10. The computer system of claim 9 wherein said fan dependent control unit further includes a normally open electronic switch coupled to said comparator, a voltage source and said chassis fan, wherein said comparator asserts a switch control signal when said fan speed voltage exceeds said threshold, which causes said switch to close to permit said voltage source to be provided to said chassis fan, thereby causing said chassis fan to spin.

11. A computer system housed in a chassis, comprising:

a CPU;

a CPU fan configured to help cool the CPU;

a chassis fan configured to help cool an interior volume of the chassis;

a fan drive coupled to said CPU and chassis fans, said fan drive produces a fan speed voltage which controls the speed of said CPU and chassis fans;

monitor logic coupled to said fan drive and which monitors a system parameter and causes said fan drive to produce a fan speed voltage at a level to operate said CPU fan at a desired speed based on said system parameter;

a fan dependent control unit coupled to said fan drive and said chassis fan and which controls said chassis fan based on how fast said CPU fan is spinning; and memory coupled to said CPU and storing software which, when executed by said CPU, causes an override signal to be asserted to said fan dependent control unit to cause said chassis fan to operate as dictated by said software.

12. The computer system of claim 11 further including an I/O controller coupled to said CPU and said override signal is asserted by said I/O controller.

13. A computer system housed in a chassis, comprising:

a CPU;

a CPU fan configured to help cool the CPU;

a chassis fan configured to help cool an interior volume of the chassis;

a fan drive coupled to said CPU and chassis fans, said fan drive produces a fan speed voltage which controls the speed of said CPU and chassis fans;

monitor logic coupled to said fan drive and which monitors a system parameter and causes said fan drive to produce a fan speed voltage at a level to operate said CPU fan at a desired speed based on said system parameter; and means for controlling said chassis fan based on how fast said CPU fan is spinning and means for selectively providing a voltage source to the chassis fan.

14. The system of claim 13 wherein the means for controlling said chassis fan further comprises a means for comparing the fan speed voltage to a threshold voltage coupled to the means for selectively providing a voltage source, wherein the voltage source is provided to the chassis fan when the fan speed voltage exceeds the threshold voltage.

* * * * *

UNITED STATES PATENT AND TRADEMARK OFFICE
CERTIFICATE OF CORRECTION

| | |
|---|---|
| PATENT NO. | : 6,856,139 B2 |
| APPLICATION NO. | : 10/154682 |
| DATED | : February 15, 2005 |
| INVENTOR(S) | : Christopher N. Rijken et al. |

It is certified that error appears in the above-identified patent and that said Letters Patent is hereby corrected as shown below:

IN THE CLAIMS

Claim 9, Column 9, line 3, delete "end" and insert therefor --and--

Signed and Sealed this

Twenty-seventh Day of May, 2008

JON W. DUDAS
*Director of the United States Patent and Trademark Office*